(12) United States Patent
Jeong et al.

(10) Patent No.: US 7,839,076 B2
(45) Date of Patent: *Nov. 23, 2010

(54) ORGANIC ELECTROLUMINESCENT DEVICE

(75) Inventors: Hye-In Jeong, Yongin (KR); Ok-Keun Song, Yongin (KR); Young-Mo Koo, Yongin (KR); Yong-Han Lee, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 513 days.

This patent is subject to a terminal disclaimer.

(21) Appl. No.: 11/191,019

(22) Filed: Jul. 28, 2005

(65) Prior Publication Data

US 2006/0228580 A1   Oct. 12, 2006

(51) Int. Cl.
*H01L 51/54* (2006.01)
*C09K 11/06* (2006.01)

(52) U.S. Cl. .............. 313/504; 313/506; 428/690; 428/917; 252/301.16; 257/40; 257/E51.049

(58) Field of Classification Search .............. None
See application file for complete search history.

(56) References Cited

U.S. PATENT DOCUMENTS

| | | | | |
|---|---|---|---|---|
| 5,085,946 A * | 2/1992 | Saito et al. | | 428/690 |
| 5,121,029 A * | 6/1992 | Hosokawa et al. | | 313/504 |
| 5,382,477 A | 1/1995 | Saito et al. | | |
| 6,447,934 B1 | 9/2002 | Suzuki et al. | | |
| 6,459,199 B1 * | 10/2002 | Kido et al. | | 313/504 |
| 6,501,217 B2 * | 12/2002 | Beierlein et al. | | 313/504 |
| 7,445,856 B2 * | 11/2008 | Jeong et al. | | 428/690 |
| 2002/0113546 A1 * | 8/2002 | Seo et al. | | 313/504 |
| 2002/0180347 A1 | 12/2002 | Adachi et al. | | |
| 2003/0165715 A1 | 9/2003 | Yoon et al. | | |
| 2004/0076853 A1 * | 4/2004 | Jarikov | | 428/690 |
| 2004/0132228 A1 * | 7/2004 | Magno et al. | | 438/99 |
| 2005/0079383 A1 | 4/2005 | Lin et al. | | |
| 2005/0118456 A1 | 6/2005 | Hamada et al. | | |

FOREIGN PATENT DOCUMENTS

| | | |
|---|---|---|
| CN | 1244277 | 2/2000 |
| CN | 1340865 | 3/2002 |
| CN | 1372434 | 10/2002 |
| CN | 1138458 | 2/2004 |

(Continued)

OTHER PUBLICATIONS

Sato et al., JP 11-345686, Machine Assisted Translation.*

(Continued)

*Primary Examiner*—D. L Tarazano
*Assistant Examiner*—Brett A Crouse
(74) *Attorney, Agent, or Firm*—H.C. Park & Associates, PLC

(57) ABSTRACT

An organic electroluminescent device comprising an organic layer is provided. The organic layer is an electron transport layer comprising an electron transport material and a blue emission material. This electron transport layer causes an increase in the blue emission efficiency and lifespan of the organic electroluminescent device while improving efficiency in red and green ranges, a driving voltage, a color coordinate, and the lifespan of the organic electroluminescent device are not changed.

13 Claims, 2 Drawing Sheets

FOREIGN PATENT DOCUMENTS

| | | |
|---|---|---|
| CN | 1571601 | 1/2005 |
| EP | 1187235 | 3/2002 |
| EP | 1265298 | 12/2002 |
| KR | 10-2004-0005416 | 1/2004 |
| WO | 03-059015 | 7/2003 |
| WO | 2004-018588 | 3/2004 |

OTHER PUBLICATIONS

Chinese Office Action dated Jun. 6, 2008.

Kowalsky et al., "Organic Electroluminescent Devices", Advances in Solid State Physics, vol. 39, Dec. 31, 1999, pp. 91-100.

Feng-Hong, et al., "Studies on the Performances of Blue Organic Electroluminescent Device with Different Electron Transport Layers", Chemical Journal of Chinese Universities, vol. 22, No. 9, Sep. 30, 2001, pp. 1573-1575.

Chinese Office Action dated Jul. 4, 2008.

Non-Final Office Action dated Jan. 15, 2008 (for related U.S. Appl. No. 11/191,017).

Final Office Action dated Jul. 28, 2008 (for related U.S. Appl. No. 11/191,017).

Non-Final Office Action dated Dec. 24, 2008 (for related U.S. Appl. No. 11/191,017).

\* cited by examiner

ORGANIC ELECTROLUMINESCENT DEVICE

This application claims priority to and the benefit of Korean Patent Application No. 10-2004-0059738, filed on Jul. 29, 2004, in the Korean Intellectual Property Office, the disclosure of which is incorporated herein in its entirety by reference.

BACKGROUND OF THE INVENTION

1. Field of the Invention

The present invention relates to an organic electroluminescent device with improved luminous efficiency.

2. Description of the Related Art

Organic electroluminescent devices are self-emissive devices that emit light when a current is applied to a fluorescent or phosphorescent organic layer and electrons and holes combine in the organic layer. Organic electroluminescent devices have many advantages including being lightweight, easy to manufacture, and having high resolution and wide viewing angles. Further, organic electroluminescent devices can display moving pictures with high color purity, and have low power consumption and low driving voltage. These advantages make organic electroluminescent devices suitable for use in portable electronic devices.

An organic electroluminescent device may include an organic layer such as a hole transport layer, an emission layer, an electron transport layer, and the like. The thickness of an organic layer determines the efficiency, driving voltage, and color coordinate of the organic electroluminescent device.

As the thickness of the emission layer increases, an organic electroluminescent device that includes the emission layer has increased efficiency. At the same time, however, the driving voltage of the organic electroluminescent device also increases.

SUMMARY OF THE INVENTION

The present invention provides an organic electroluminescent device that has a high efficiency, a low driving voltage, an excellent color coordinate, and a long lifetime.

Additional features of the invention will be set forth in the description which follows, and in part will be apparent from the description, or may be learned by practice of the invention.

The present invention discloses an organic electroluminescent device that includes an organic layer that is formed between a pair of electrodes. The organic layer is an electron transport layer that comprises an electron transport material and a blue emission material.

The present invention also discloses an organic electroluminescent device that comprises a first electrode, an emission layer formed on the first electrode, and an electron transport layer comprising an electron transport material and a blue emission material that is formed on the emission layer. The device also includes a second electrode that is formed on the electron transport layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
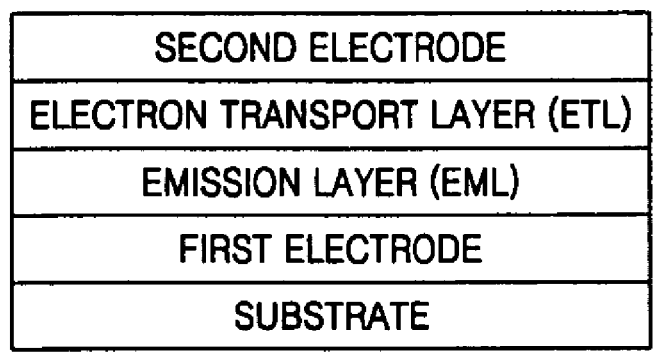
FIG. 1 illustrates the structure of an organic electroluminescent device according to an exemplary embodiment of the present invention.

An electron transport layer of an organic electroluminescent device according to an exemplary embodiment of the present invention includes an electron transport material and a blue emission material such as a blue phosphorescent or fluorescent host.

An organic electroluminescent device according to an exemplary embodiment of the present invention comprises an electron transport layer comprising an electron transport material and a blue emission material. The blue emission efficiency and lifespan of the organic electroluminescent device increase while efficiency in red and green ranges, driving voltage, and a color coordinate of the organic electroluminescent device are not changed.

Color coordinate characteristics depend on the thickness of an organic layer that emits blue light in an organic electroluminescent device. When the electron transport layer comprises an electron transport material and a blue emission material, the organic electroluminescent device including the electron transport layer has excellent blue emission efficiency and a long lifespan. In particular, the electron transport layer produces blue and green light more efficiently, has a lower driving voltage, better color coordinate characteristics, and a longer lifespan than an electron transport layer comprising an electron transport material alone.

The electron transport layer according to the present embodiment may include 30 wt % to 70 wt % of the blue emission material based on the total weight of the electron transport material. When the concentration of the blue emission material is less than 30 wt %, the use of the electron transport layer has little effect. When the concentration of the blue emission material is more than 70 wt %, the driving voltage increases.

The electron transport material of the present invention has greater electron mobility than hole mobility. The electron mobility is in the range of $1\times10^{-3}$ to $1\times10^{-5}$ cm$^2$/Vs and the hole mobility is in the range of $1\times10^{-5}$ to $1\times10^{-7}$ cm$^2$/Vs. The electron transport material may include but is not limited to Alq3, PBD, TAZ, BND, DV, and OXD, which are represented by the following chemical structures:

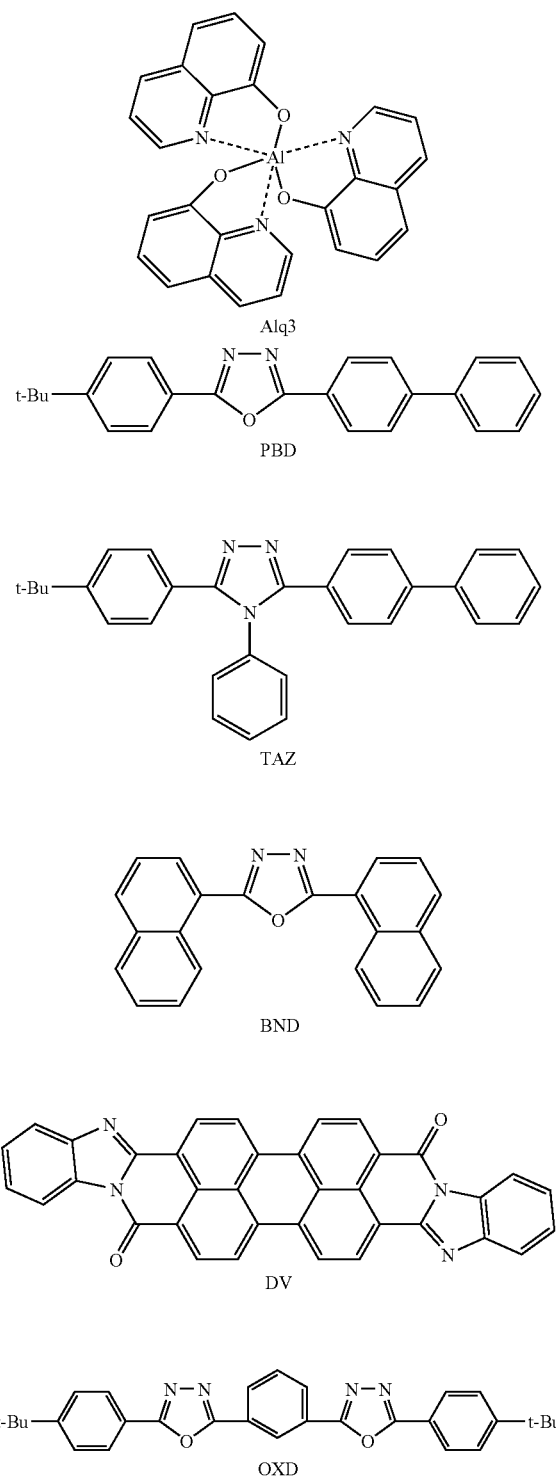
The blue emission material has a maximum absorption wavelength (λmax) of 400 nm to 500 nm. Examples of the blue emission material may include but are not limited to Spiro-DPVBi, Compound (A), Flrpic, CzTT, anthracene, TPB, PPCP, DST, TPA, OXD-4, BBOT, AZM-Zn, and Compound (B) which are represented by the following chemical structures:

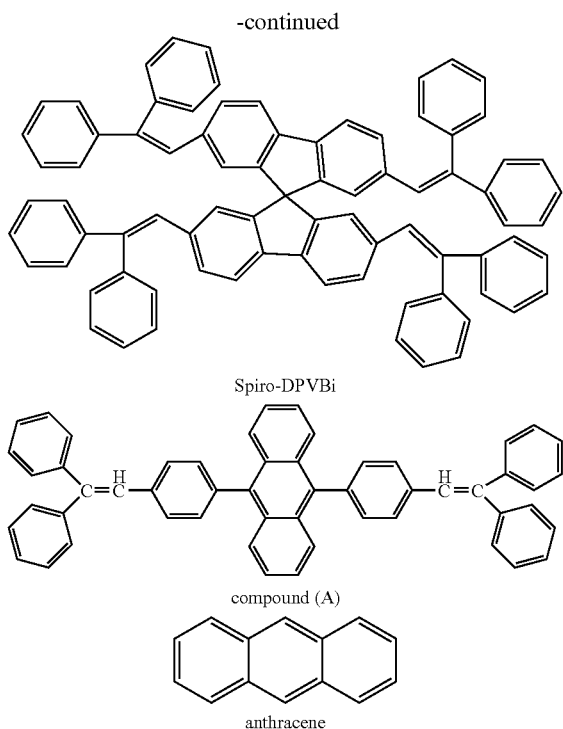

In addition, the compounds disclosed in Japanese Patent Laid-Open Publication 2000-192028, 2000-191560, 2000-48955, and 2000-7604, Japanese Patent No. Hei. 10-11063, and U.S. Pat. No. 6,591,636, which are incorporated into the present invention by reference may also be used as the blue emission material of the electron transport layer.

The electron transport layer may be about 150 Å to 600 Å thick. When the electron transport layer is less than 150 Å thick, the lifespan of the organic electroluminescent device decreases. When the electron transport layer is more than 600 Å thick, the driving voltage of the organic electroluminescent device increases.

FIG. 1 illustrates the structure of an organic electroluminescent device according to an exemplary embodiment of the present invention.

Referring to FIG. 1, the organic electroluminescent device includes a first electrode, an emission layer (EML), an electron transport layer (ETL), and a second electrode that are stacked on a substrate.

Figure 2:
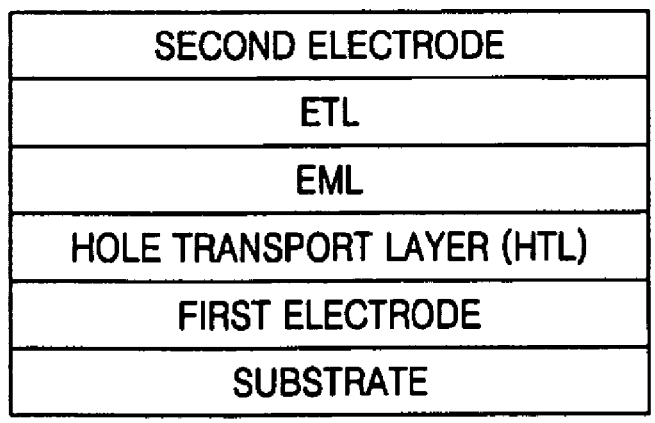
FIG. 2 illustrates the structure of an organic electroluminescent device according to another exemplary embodiment of the present invention.

FIG. 2 illustrates the structure of an organic electroluminescent device according to another exemplary embodiment of the present invention.

The organic electroluminescent device of FIG. 2 differs from the organic electroluminescent device of FIG. 1 in that a hole transport layer (HTL) may also be formed between the first electrode and the EML.

Figure 3:
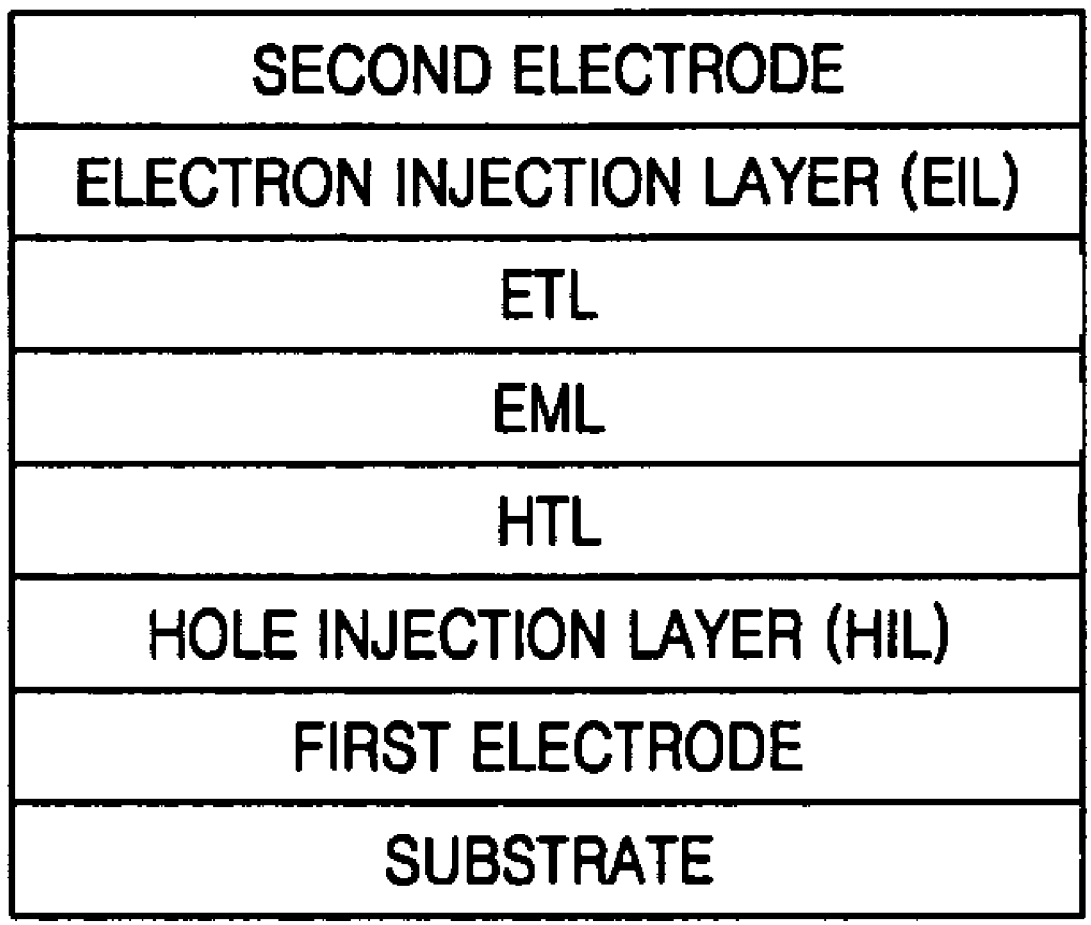
FIG. 3 illustrates the structure of an organic electroluminescent device according to another exemplary of the present invention.

FIG. 3 illustrates the structure of an organic electroluminescent device according to another exemplary embodiment of the present invention.

The organic electroluminescent device of FIG. 3 differs from the organic electroluminescent device of FIG. 2 in that a hole injection layer (HIL) may also be formed between the first electrode and the HTL. In addition, an electron injection layer (EIL) may also be formed between the ETL and the second electrode.

A method of fabricating an organic electroluminescent device according to an exemplary embodiment of the present invention will now be described with reference to FIG. 1, FIG. 2, and FIG. 3.

The substrate is any workable substrate that may be used in an organic electroluminescent device such as a glass substrate or a transparent plastic substrate that is transparent and waterproof, has a smooth surface, and can be easily treated. An upper surface of the substrate is coated with an anode material to form an anode which is used as a first electrode. The anode may comprise a transparent and highly conductive material such as Indium Tin Oxide (ITO), Indium Zinc Oxide (IZO), $SnO_2$, and ZnO, for example.

After the anode is formed, a hole injection layer material may optionally be vacuum-thermal deposited on the anode to form a hole injection layer. Alternatively, the anode is optionally spin-coated with the hole injection layer material to form the hole injection layer. The hole injection layer material may comprise copper phthalocyanine (CuPc), a starburst-type amine such as TCTA, m-MTDATA, or HI406 (from Idemitz Co.) and the like. The hole injection layer may be in the range of 300 Å to 1500 Å thick. When the hole injection layer is less than 300 Å thick, the lifespan and reliability of the organic electroluminescent device decrease. When the hole injection layer is greater than 1500 Å thick, the driving voltage of the resulting device increases.

After the hole injection layer is formed, a hole transport layer material may be vacuum-thermally deposited on the hole injection layer to form a hole transport layer. Alternatively, the hole injection layer may be spin-coated with the hole transport material to form the hole transport layer. The hole transport layer may be in the range of 100 Å to 700 Å thick. When the hole transport layer is less than 100 Å thick, the hole transporting ability deteriorates. When the HTL is more than 700 Å thick, the driving voltage of the resulting device increases.

The hole transport layer material may comprise but is not limited to N, N'-bis(3-methylphenyl)-N, N'-diphenyl-[1,1-biphenyl]-4,4'-diamine (TPD), N, N'-di(naphthalene-1-yl)-N, N'-diphenylbenzidine (α-NPD), and IDE320 (from Idemitz Co.).

After the hole transport layer is formed, an emission layer may be formed on it. An emission layer material used to emit blue light may comprise an oxadiazole dimer dye (Bis-DAPOXP), a spiro compound (Spiro-DPVBi, Spiro-6P), a triarylamine compound, bis(styryl)amine (DPVBi, DSA), a Compound (A), Flrpic, CzTT, Anthracene, TPB, PPCP, DST, TPA, OXD-4, BBOT, or AZM-Zn, for example. An emission layer material used to emit green light may be Coumarin 6, C545T, Quinacridone, or Ir(ppy)$_3$, for example. An emission layer material used to emit red light may be DCM1, DCM2, Eu(thenoyltrifluoroacetone)$_3$ (Eu(TTA)$_3$), or butyl-6-(1,1,7,7,-tetramethyljulolidyl-9-enyl)-4H-pyran (DCJTB), for example. The emission layer may be in the range of 200 Å to 600 Å thick. When the emission layer is less than 200 Å thick, the lifespan of the device decreases. When the emission layer is more than 600 Å thick, the driving voltage of the resulting device increases.

After the emission layer is formed, an electron transport material and a blue emission material may be vacuum deposited on the emission layer to form an electron transport layer. Alternatively, the emission layer is spin-coated with the electron transport material and the blue emission material to form the electron transport layer. The thickness of the electron transport layer may be the same as described above.

Optionally, a hole blocking layer may be formed between the emission layer and the electron transport layer. In order to form the hole blocking layer, a hole blocking material is vacuum deposited between the emission layer and the electron transport layer, or the emission layer is spin-coated with the hole blocking material. The hole blocking material may have an electron transporting ability and an ionization potential that are greater than the ionization potential of the emission material. The hole blocking material may be Balq, BCP, TPBI, or the like. The hole blocking layer may be in the range of 10 to 200 Å thick. When the thickness of the hole blocking layer is less than 10 Å, the hole blocking ability is low, which is undesirable. When the hole blocking layer is more than 200 Å thick, the driving voltage increases substantially.

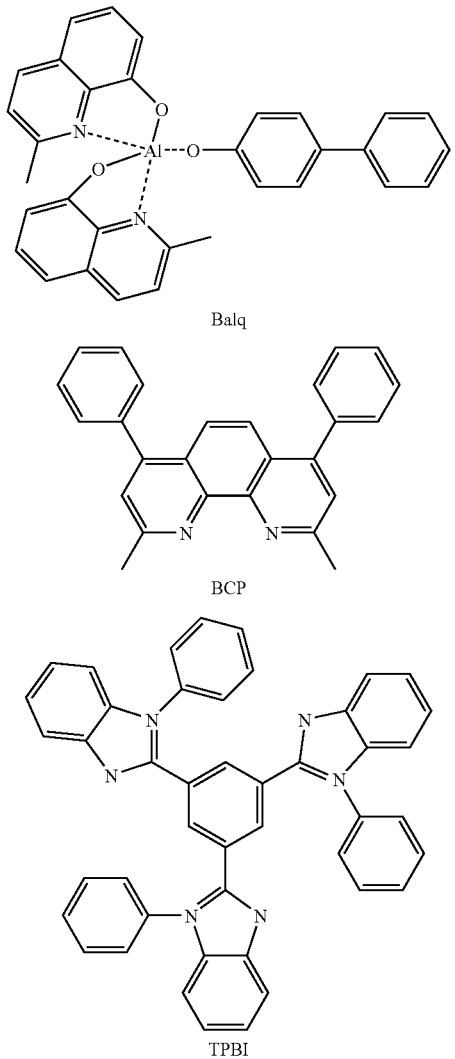

Balq

BCP

TPBI

Optionally, an electron injection layer may be formed on the electron transport layer or the hole blocking layer. The electron injection layer may comprise LiF, NaCl, CsF, Li$_2$O, BaO, Liq, for example. The electron injection layer may be in the range of 5 Å to 20 Å thick. When the electron injection layer is less than 5 Å thick, an electron injecting ability decreases. When the electron injection layer is greater than 20 Å thick, an electron injection ability is low.

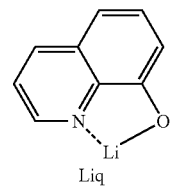

Liq

After the electron injection layer is formed, a cathode metal is vacuum-thermal deposited on the electron injection layer to form a cathode, which is a second electrode. The cathode metal may comprise Li, Mg, Al, Al—Li, Ca, Mg—In, or Mg—Ag, for example.

The present invention will now be described in further detail with reference to the following examples. The following examples are for illustrative purposes and are not intended to limit the scope of the present invention.

EXAMPLE 1

First, a glass substrate with an ITO electrode (from Corning Co., surface resistance 15 Ω/cm², thickness 1200 Å), used as an anode, was cut to a size of 50 mm×50 mm×0.7 mm. The glass substrate was cleaned using ultrasonic waves in isopropyl alcohol for 5 minutes, cleaned using ultrasonic waves in pure water for 5 minutes, and cleaned using UV light and ozone for 30 minutes.

Next, IDE406 (from Idemitz Co.) was vacuum-deposited on the glass substrate to form a 600 Å thick hole injection layer. Subsequently, NPB was vacuum-deposited on the hole injection layer to form a 200 Å thick hole transport layer.

Then, about 98 wt % of a compound represented by Compound B (blue host) and about 2 wt % of BD102 (a blue dopant, from Idemitz Co.) were deposited on the hole transport layer to form a 300 Å thick emission layer. Subsequently, 50 wt % of Alq3 used as an electron transport material and 50 wt % of the compound represented by Compound B used as a sky blue emission material were co-deposited on the emission layer to form a 250 Å thick electron transport layer.

LiF was vacuum-deposited on the electron transport layer to a thickness of 10 Å to form an electron injection layer and Al was deposited on the electron injection layer to a thickness of 1000 Å to form a cathode, thereby forming a LiF/Al electrode.

EXAMPLE 2

An organic electroluminescent device was fabricated in the same manner as in Example 1, except that a deep blue emission material was used to form the electron transport layer instead of the compound represented by Compound B.

EXAMPLE 3

An organic electroluminescent device was fabricated in the same manner as in Example 1, except that the hole injection layer comprised MTDATA, the hole transport layer comprised IDE320, and the emission layer comprised BH-013X (from Idemitsu Co.) as a blue host.

COMPARATIVE EXAMPLE 1

An organic electroluminescent device was fabricated in the same manner as in Example 1, except that the electron transport layer comprised only Alq3 as the electron transport material, without the sky blue emission material.

COMPARATIVE EXAMPLE 2

An organic electroluminescent device was fabricated in the same manner as in Example 1, except that the electron transport layer comprised only the electron transport material without the sky blue emission material.

The driving voltage, luminance, efficiency, and color coordinate of the organic electroluminescent devices fabricated according to Example 1 and Example 2, and Comparative Example 1 and Comparative Example 2 were measured. The results are shown in Table 1.

TABLE 1

| | Voltage (V) | Luminance | Efficiency | Color coordinate x | y |
|---|---|---|---|---|---|
| Example 1 | 7.80 | 13015 | 13.01 | 0.167 | 0.284 |
| Comparative Example 1 | 8.29 | 1115 | 11.11 | 0.168 | 0.286 |
| Example 2 | 7.53 | 5951 | 5.95 | 0.147 | 0.130 |
| Comparative Example 2 | 7.75 | 5230 | 5.23 | 0.147 | 0.138 |

Referring to Table 1, the organic electroluminescent device of Example 1 emitted skyblue light, had a low driving voltage, high luminance, high efficiency, and excellent color coordinate characteristics when compared to the organic electroluminescent device of Comparative Example 1. The organic electroluminescent device of Example 2 emitted deep blue light, had a low driving voltage, high luminance, high efficiency, and excellent color coordinate characteristics compared to the organic electroluminescent device of Comparative Example 2.

In addition, the organic electroluminescent devices of Example 1 and Example 2 had a similar driving voltage, luminance, efficiency, color coordinates.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device comprising:
a first electrode;
a hole transport layer formed on the first electrode;
an emission layer formed on the hole transport layer;
an electron transport layer comprising an electron transport material and a blue emission material formed on the emission layer; and
a second electrode formed directly on the electron transport layer,
wherein the blue emission material comprises a compound represented by the following chemical structure:

Compound (B)

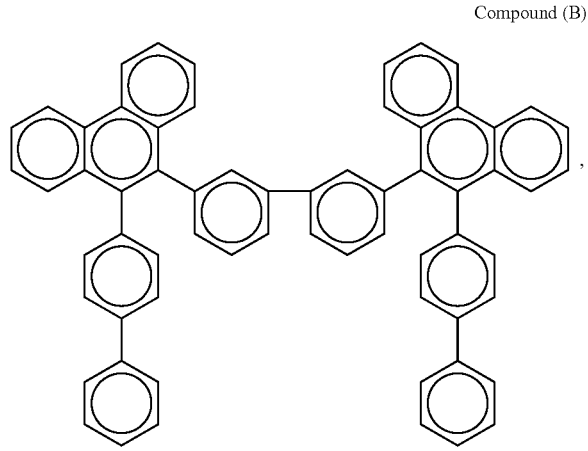

and
wherein the electron transport layer includes 30 wt % to 70 wt % of the blue emission material based on the weight of the electron transport material.

2. The organic electroluminescent device of claim 1,
wherein the electron transport material comprises a compound selected from the group consisting of the compounds represented by the following chemical structures:

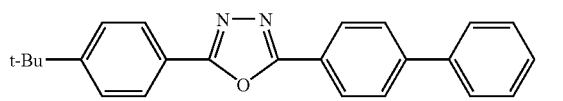

PBD

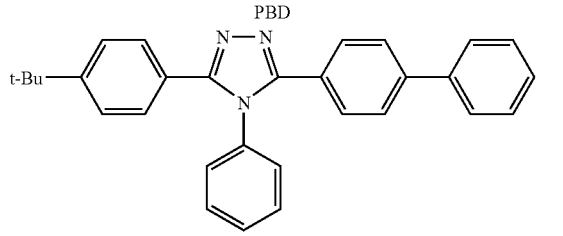

TAZ

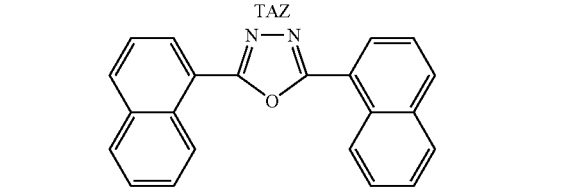

BND

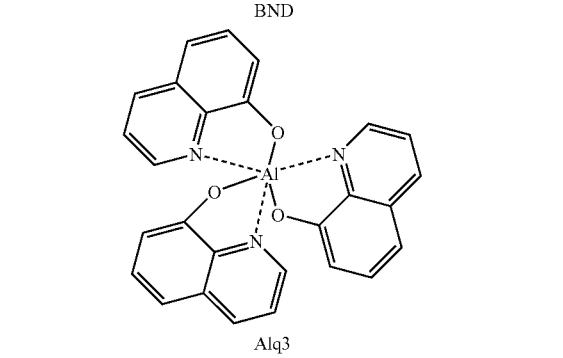

Alq3

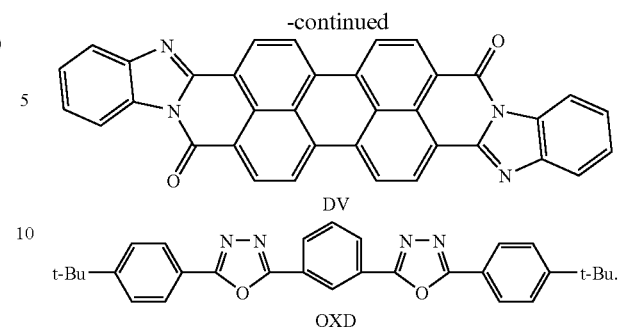

3. The organic electroluminescent device of claim 1, wherein the electron transport layer is in the range of 150 Å to 400 Å thick.

4. The organic electroluminescent device of claim 1, further comprising:
a layer selected from the group consisting of a hole injection layer and a hole blocking layer.

5. The organic electroluminescent device of claim 1, wherein a hole injection layer or the hole transport layer is formed between the first electrode and the emission layer.

6. The organic electroluminescent device of claim 1, wherein the electron transport layer comprises the following chemical structures:

Alq3

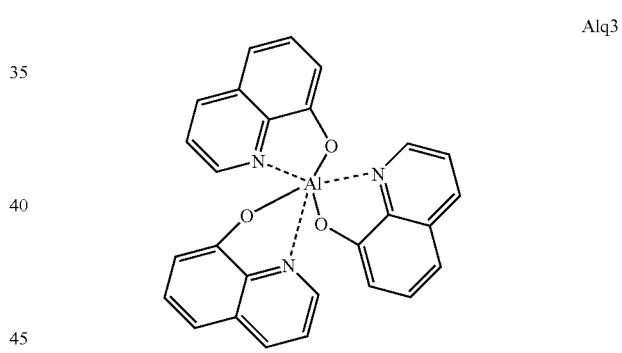

Compound (B)

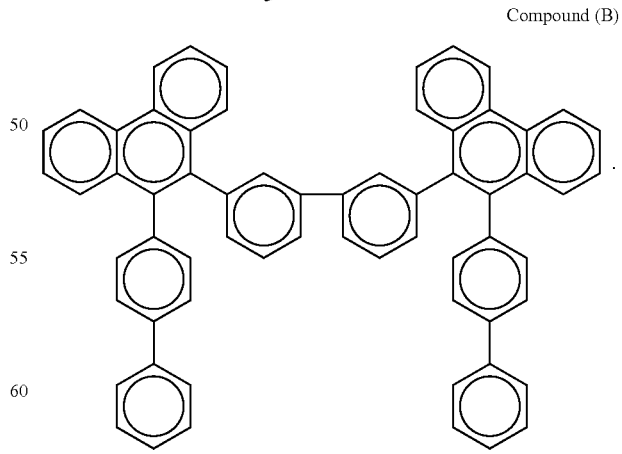

7. An organic electroluminescent device, comprising:
a first electrode;
an emission layer formed on the first electrode;

an electron transport layer comprising an electron transport material and a blue emission material formed on the emission layer; and a second electrode formed directly on the electron transport layer, wherein the blue emission material comprises a compound represented by the following chemical structure:

Compound (B)

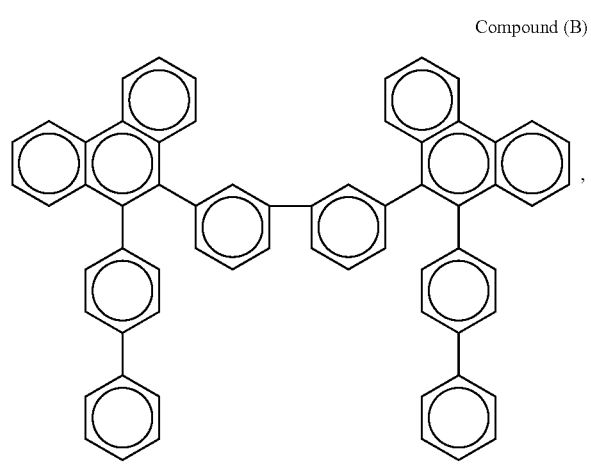

and wherein the electron transport layer includes 30 wt % to 70 wt % of the blue emission material based on the weight of the electron transport material.

8. The organic electroluminescent device of claim 7, wherein the electron transport material is a compound selected from the group consisting of the compounds represented by the following chemical structures:

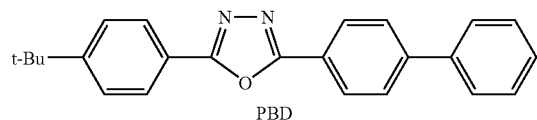
PBD

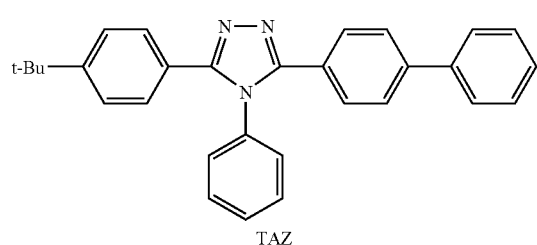
TAZ

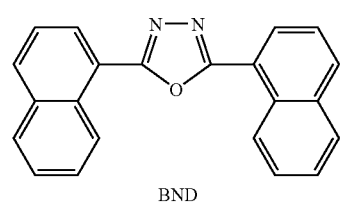
BND

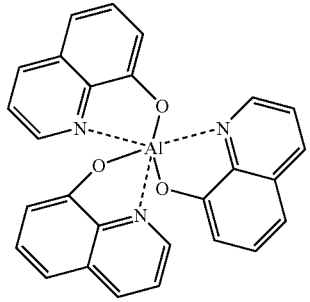
Alq3

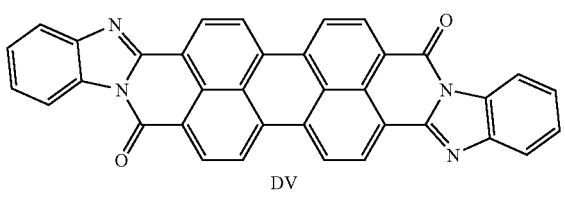
DV

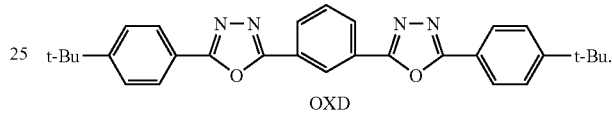
OXD

9. An organic electroluminescent device comprising:
a first electrode;
a hole transport layer formed on the first electrode;
an emission layer formed on the hole transport layer;
an electron transport layer comprising an electron transport material and a blue emission material formed on the emission layer;
an electrode injection layer formed directly on the electron transport layer; and
a second electrode formed on the electrode injection layer,
wherein the blue emission material comprises a compound represented by the following chemical structure:

Compound (B)

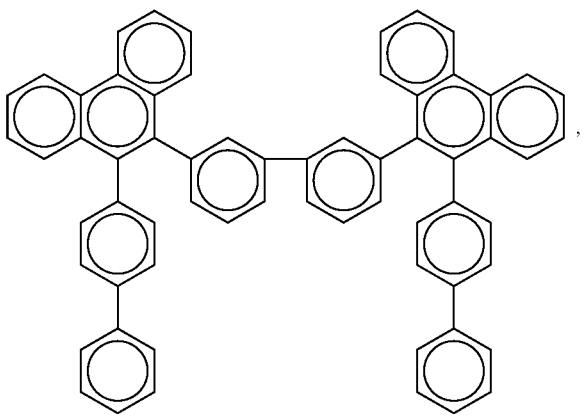

and
wherein the electron transport layer includes 30 wt % to 70 wt % of the blue emission material based on the weight of the electron transport material.

10. The organic electroluminescent device of claim 9, wherein the electron transport material comprises a compound selected from the group consisting of the compounds represented by the following chemical structures:

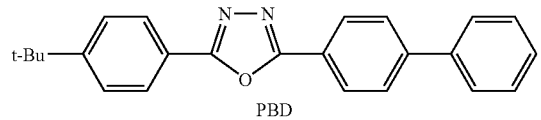
PBD

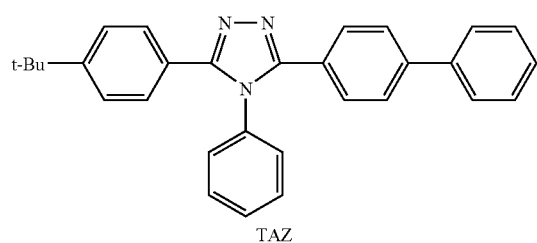
TAZ

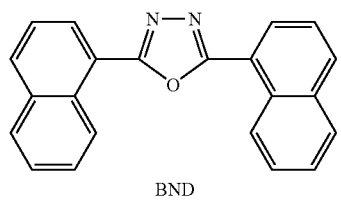
BND

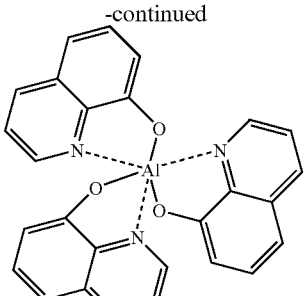
Alq3

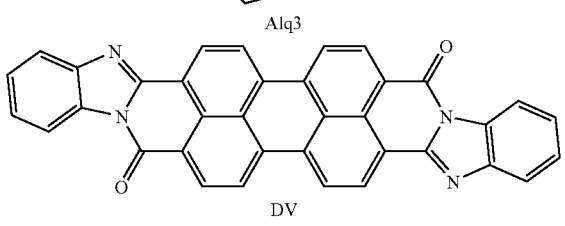
DV

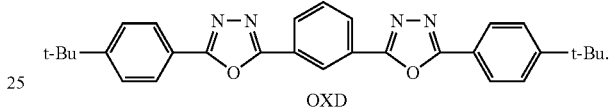
OXD

11. The organic electroluminescent device of claim 9, wherein the electron transport layer is in the range of 150 Å to 400 Å thick.

12. The organic electroluminescent device of claim 9, further comprising:
a layer selected from the group consisting of a hole injection layer and a hole blocking layer.

13. The organic electroluminescent device of claim 9, wherein a hole injection layer or the hole transport layer is formed between the first electrode and the emission layer.

* * * * *